United States Patent [19]

Sunter

[11] Patent Number: 4,797,580

[45] Date of Patent: Jan. 10, 1989

[54] CURRENT-MIRROR-BIASED PRE-CHARGED LOGIC CIRCUIT

[75] Inventor: Stephen K. Sunter, Nepean, Canada

[73] Assignee: Northern Telecom Limited, Montreal, Canada

[21] Appl. No.: 114,552

[22] Filed: Oct. 29, 1987

[51] Int. Cl.[4] .................. H03K 17/16; H03K 19/017; H03K 19/094

[52] U.S. Cl. .................................... 307/451; 307/443; 307/448

[58] Field of Search ............ 357/443, 448, 451, 296 R

[56] References Cited

U.S. PATENT DOCUMENTS

| | | | |
|---|---|---|---|
| 3,942,778 | 3/1976 | Hsiao et al. | 307/297 |
| 4,051,392 | 9/1977 | Rosenthal et al. | 307/297 |
| 4,442,398 | 4/1984 | Bertails et al. | 307/296.8 |

Primary Examiner—John S. Heyman
Assistant Examiner—Margaret Rose Wambach
Attorney, Agent, or Firm—Philip W. Jones

[57] ABSTRACT

Current-mirror circuitry is utilized on a MOS integrated circuit for regulating the amount of current entering the pre-charged nodes of a pre-charged logic circuit. The current-mirror circuitry involves a series of bias transistors, each extending in parallel with a respective one of the pre-charge transistors, and a bias current circuit. The bias current circuit is formed by a transistor and a resistance element which are serially connected across the power supply of the logic circuit. The gate of the bias circuit transistor is connected to the gates of the bias transistors, and the current passing through each bias transistor depends upon the relative dimensions between that transistor and the respective bias circuit transistor. The value of the resistance element determines the amount of current passing through the bias circuit transistor and therefore through the bias transistors.

8 Claims, 5 Drawing Sheets

CURRENT-MIRROR-BIASED PRE-CHARGED LOGIC CIRCUIT

The invention relates to a means for biasing the pre-charged node of a pre-charged logic circuit, and more particularly, to a means for providing a precise level of bias current to that node during the evaluate cycle.

Pre-charged logic has emerged as a popular technique for implementing high density logic on integrated circuits. Pre-charged logic has two basic forms—Domino Logic and No Race Logic (NORA). Domino Logic, as described by R. H. Krambeck, C. M. Lee, and H. S. Law in 'High-Speed Compact Circuits with CMOS', in the June, 1982 edition of the I.E.E.E. Journal of Solid-State Circuits, Volume SC-17, pp. 614–619, utilizes the signal of a single clock for pre-charging a pre-charged node to the potential on one terminal of a supply voltage during one portion of the clock cycle (the pre-charge portion) and for evaluating a logic network positioned between the pre-charged node and the other terminal of the supply voltage during another portion of the cycle (the evaluate portion). Complementary metal oxide semiconductor (CMOS) technology is often employed for pre-charged logic. Since the n-channel transistors in the CMOS process are typically much faster for a given area than the p-channel transistors, the logic network for Domino Logic is constructed from a serial and/or parallel arrangement of n-channel transistors. A p-channel transistor is used to control the charging of the pre-charged node; when the clock is at its low level that p-channel transistor is fully on and pre-charges the pre-charged node to a high state. An n-channel transistor that is in series with the logic network is also connected to the clock, and that transistor is fully off when the p-channel transistor is fully on. No contention can therefore exist on the pre-charged node; it is either high or low. When the clock is at its high level the p-channel transistor is turned off and the n-channel transistor is turned on; the charge will dissipate from the pre-charged node only if a path for the current is formed through the logic network of n-transistors. For instance, if two inputs A and B form the logic network and are connected in series, ie. representing the Boolean function (A AND B), then unless both A and B have high voltages on their gates, the charge on the pre-charged node will not be discharged during the evaluate cycle. The output of the Domino Logic circuit is obtained by inverting the state of the pre-charged node; the inverter also acts to buffer the output signal.

To assist in an understanding of the text, certain prior art figures will be discussed, in which.

Figure 7:
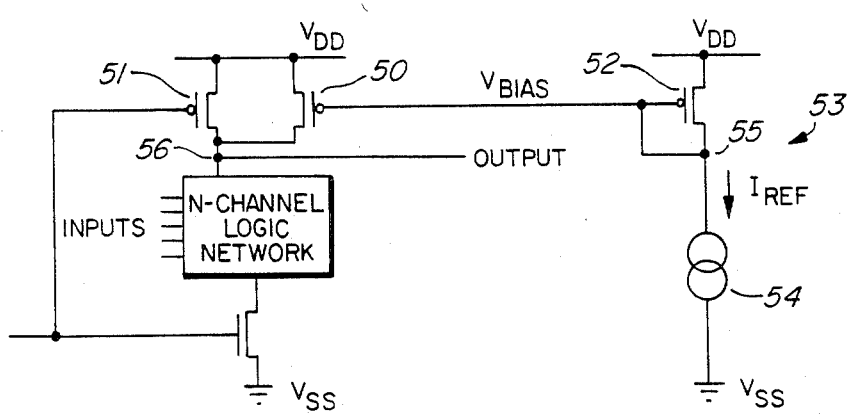

The preferred embodiments of the invention are included in the following figures, in which:

FIG. 7 is an illustration of a circuit having a bias current source controlled by a current mirror.

Figure 8:
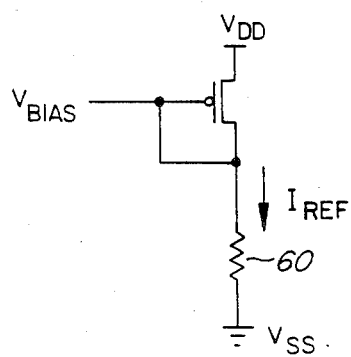

FIG. 8 is an illustration of a first type of bias circuit that may be used as a current mirror to control bias current flow to the pre-charged node of logic circuits having p-channel pre-charge transistors.

Figure 9:
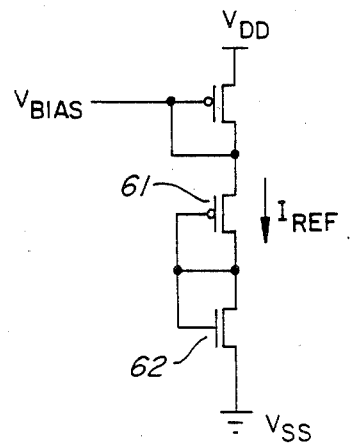

FIG. 9 is an illustration of a second type of bias circuit that may be used as a current mirror to control bias current flow to the pre-charged node of logic circuits having n-channel pre-charge transistors.

Figure 10:
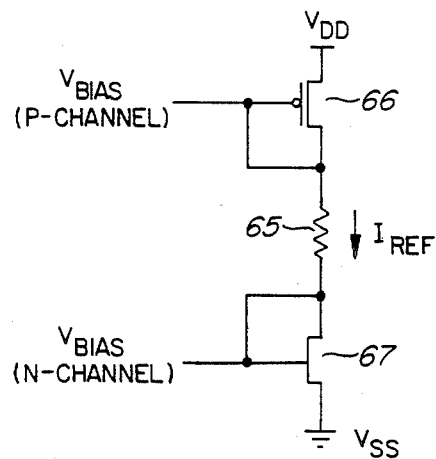

FIG. 10 is an illustration of a third type of bias circuit that may be used as a current mirror to control bias current flow to the pre-charged node of logic circuits having either n-channel or p-channel pre-charge transistors.

Figure 11:
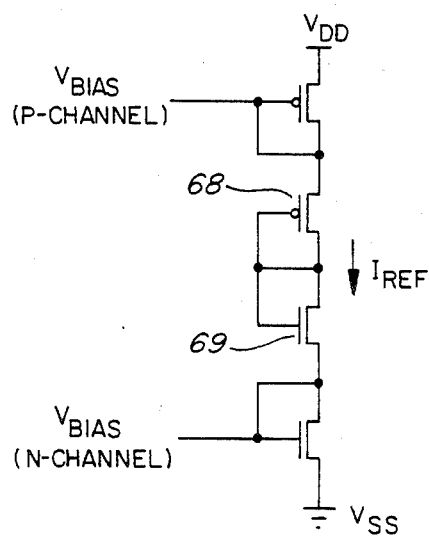

FIG. 11 is an illustration of a fourth type of bias circuit that may be used as a current mirror to control bias current flow to the pre-charged node of logic circuits having either n-channel or p-channel pre-charge transistors.

Figure 1:
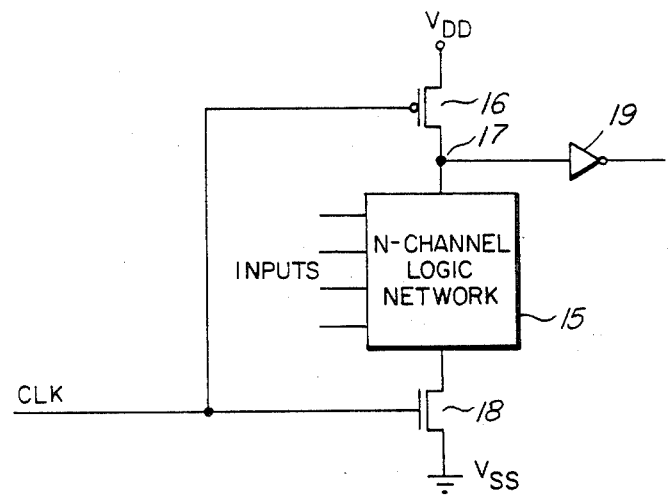
FIG. 1 is an illustration of a Domino Logic circuit.

With reference to the Domino Logic circuit of FIG. 1, n-channel logic network 15 houses the n-channel transistors defining the Boolean function as earlier described. The other elements shown in FIG. 1 are p-channel pre-charge transistor 16, pre-charged node 17, n-channel discharge transistor 18, and output inverter 19.

Figure 2:
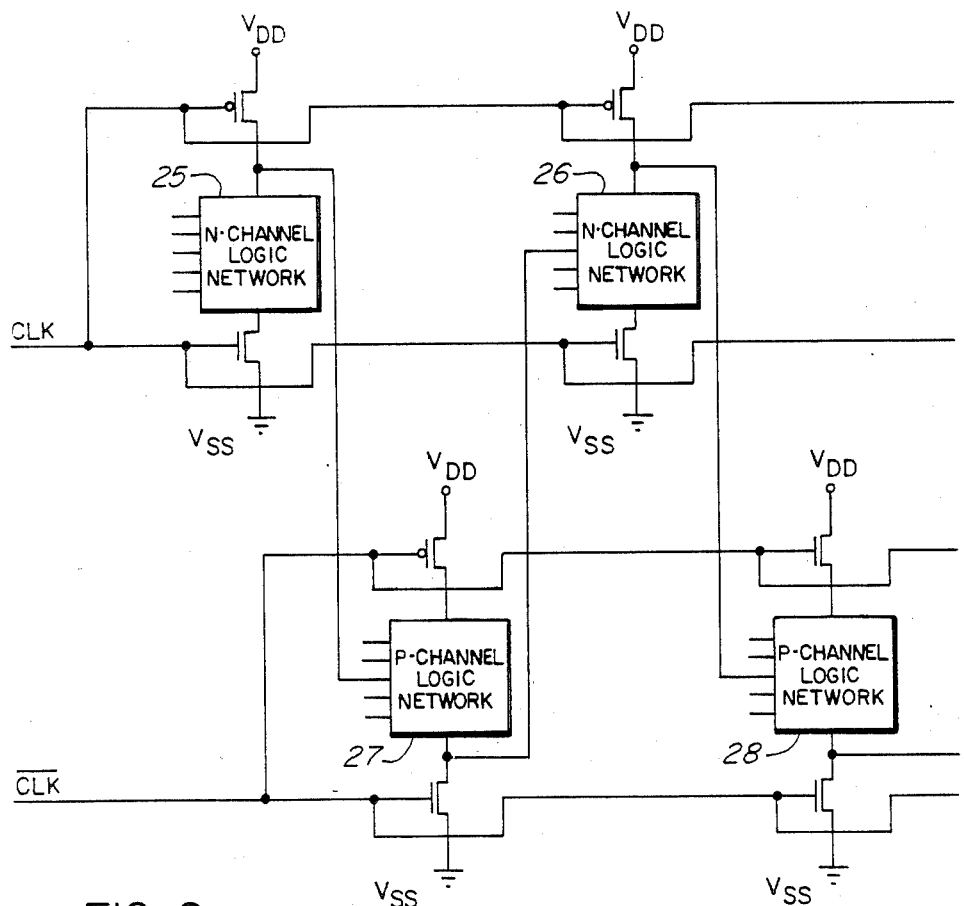
FIG. 2 is an illustration of a No Race Logic circuit.

As indicated, the other form of pre-charged logic bears the acronym NORA. NORA, which is illustrated in FIG. 2, is described in an article by N. F. Goncalves and H. J. de Man, entitled 'NORA: A Racefree Dynamic CMOS Technique for Pipelined Logic Structures', in the I.E.E.E.Journal of Solid-State Circuits; Volume SC-18, No. 3; pp. 261–266; June, 1983. NORA utilizes the basic concept of Domino Logic, including a single clock, but improves on it by obviating the need for an inverter at the output of each pre-charged node. This is accomplished by connecting together Domino circuits in such a way that the pre-charged node of one becomes one of the inputs to the next. Those portions of the circuit of FIG. 2 that contain n-channel logic networks 25 and 26 operate in a similar fashion to those earlier described with respect to Domino Logic. Those portions of the circuit of FIG. 2 that contain p-channel logic networks 27 and 28, however, operate in a complementary fashion to the n-channel logic network portions in that current is being discharged through the logic networks of the former while the pre-charged nodes of the latter are being pre-charged, and vice versa.

Both the Domino Logic and the No Race Logic techniques provide the advantage of utilizing fewer transistors than a fully complementary logic implementation, and thus utilizing less area. Since each input goes to only one transistor, less input capacitance is involved which results in greater speed and lower power consumption than would otherwise be possible. One disadvantage of both circuits, however, is the degradation of the voltage potential on the pre-charged node, and the resultant effect on the signal propagation. The voltage degradation results from several sources. The first and most significant source is the partial discharge of the pre-charged node that results when some of the logic network transistors turn on during an evaluate cycle in which the logic network function is not realized. This would occur, for instance, during an evaluate cycle in which only input A of the function (A AND B) was positive; the turning on of the transistor representing input A would partially discharge the pre-charged node. Another source is capacitive coupling of the pre-charged node to changes in the state of unrelated signals of the logic network, those changes providing a 'capacitive kick'. A third but less significant source is the junction leakage from the pre-charged node.

Figure 3:
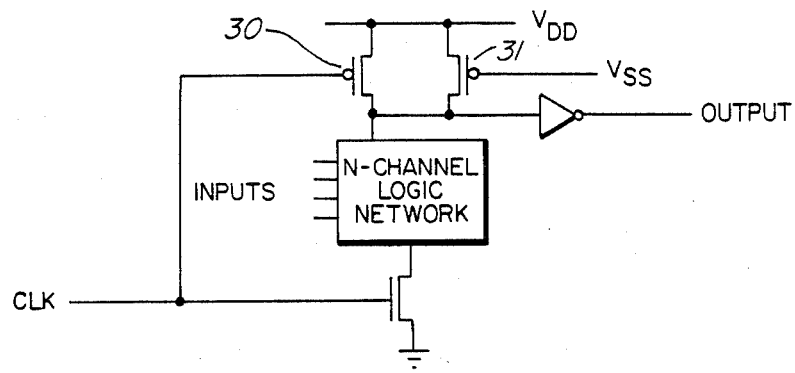
FIG. 3 is an illustration of a Domino Logic circuit having a bias current source controlled by a power rail.

Four methods have been used in attempts to avoid the partial discharge problem. The first method is one proposed by Goncalves and de Man in the previously-cited reference, and illustrated in FIG. 3. With reference to a circuit pre-charged through a p-channel transistor 30, the circuit would utilize a weak second p-channel transistor 31, having its gate connected to $V_{SS}$, as a source of bias current into the pre-charge node. The transistor would typically be quite large in area since a weak transistor requires a longer conducting channel. The current which flows through the second transistor is directly proportional to $V_{DD}-V_{SS}$, and dependent on the threshold voltage of the p-channel transistor. In each circuit in FIG. 2 containing a p-channel logic network, a weak n-channel transistor would be utilized to create a similar small bias current. In either situation, the 'weak' transistor must be sufficiently weak that power is not excessive when the output state causes this current to flow; otherwise, the power saving that results from utilizing complementary p-channel, n-channel technology would be lost.

Figure 4:
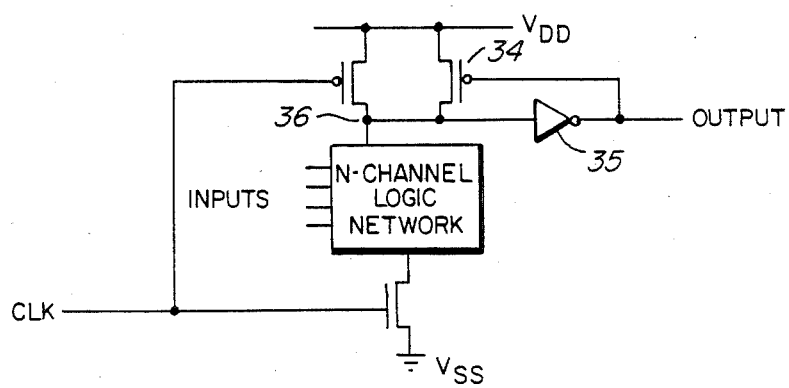
FIG. 4 is an illustration of a Domino Logic circuit having a bias current source controlled by the logic output of the pre-charged node.

The second method for avoiding the partial discharge problem involves the use of a weak second transistor as in the first method, but involves connecting that transistor to the inverted output of the pre-charged node rather than to $V_{SS}$. This arrangement, which is most suited to Domino Logic, is illustrated in FIG. 4. The second transistor 34 is only turned on when the output of inverter 35 is low, ie. when the pre-charged node 36 is high. No current flows through second transistor 34 when pre-charged node 36 is high, and there is also no current flow when it is low since the inverter output in that case is low. Current only flows through second transistor 34 if the pre-charged node starts to discharge and to assume a value between high and low. This circuit requires an inverter at the output of each pre-charge node, and thus a NORA circuit utilizing this scheme requires considerably more area. As with the first method, the weak second transistor has a long conducting channel and uses considerable area, though not as much area as in the first method. This method is discussed more fully in V. G. Oklobdzija and R. K. Montoye; 'Design-Performance Trade-Offs in CMOS Domino Logic'; Digest of Custom Integrated Circuits Conference, I.E.E.E.; pp. 334–337; May, 1985.

Figure 5:
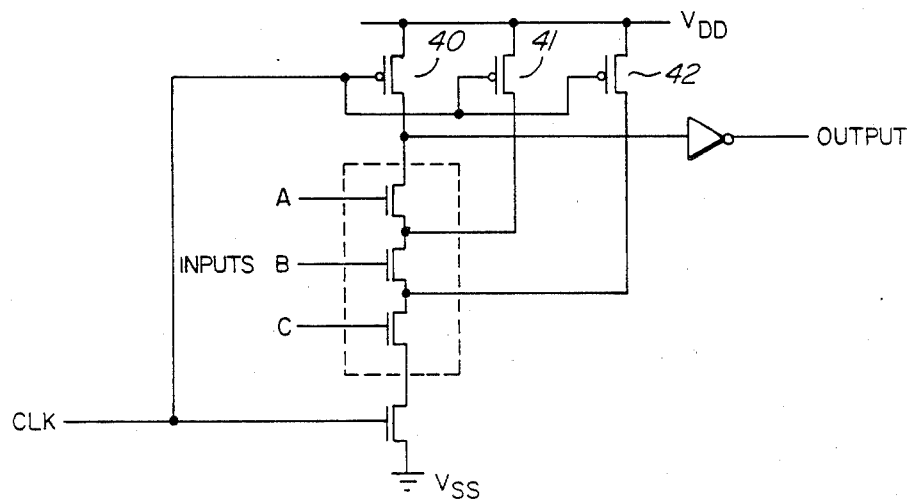
FIG. 5 is an illustration of a Domino Logic circuit in which each node of the logic network has its own connected pre-charge transistor.

The third method involves the utilization of extra pre-charge transistors to ensure that all of the nodes of the logic network are fully pre-charged to the proper voltage. The effect of the extra pre-charge transistors is to avoid during the evaluate cycle a voltage discharge across any transistors that are 'turned on' in the logic network. This concept is illustrated in FIG. 5 for the logic network representing (A AND B AND C). Three pre-charge transistors 40, 41, and 42 are utilized. The drawback of this technique is its requirement for extra pre-charge transistors and, because of the resultant increase in area and the greater capacitance to be discharged, the slowness of the circuit. This is more fully discussed in an article by C. M. Lee and E. W. Szeto, 'Zipper CMOS', in I.E.E.E. Circuits and Devices; Volume 2, pp. 10–17; May, 1986.

Figure 6:
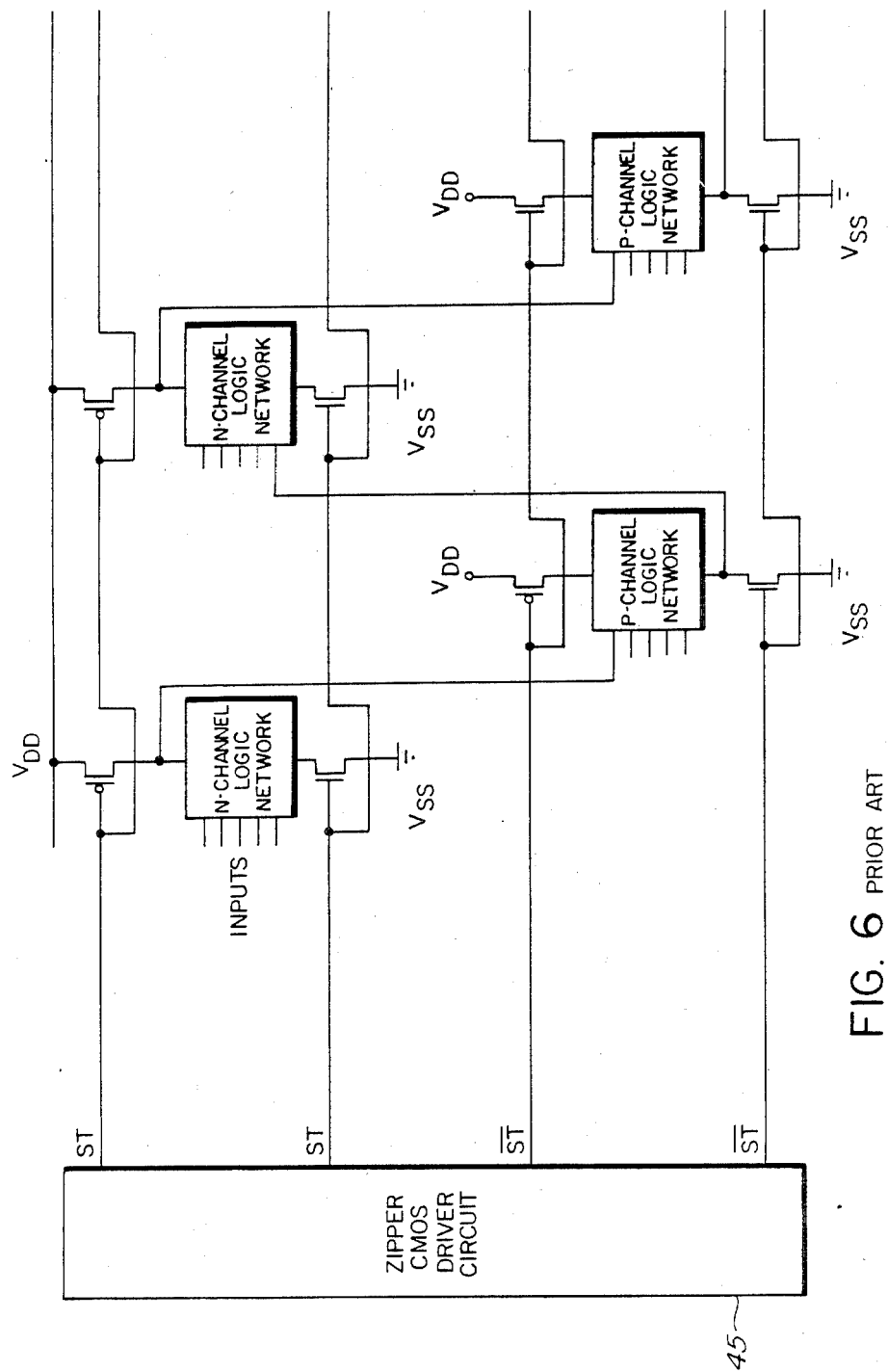
FIG. 6 is an illustration of Zipper Logic circuitry in which the pre-charge transistors never turn completely off.

A fourth method, referred to as 'Zipper Logic', is based on the principle of never completely turning off the pre-charge transistor. It is turned off only to the point where a very small current still flows. This method, which utilizes the circuitry illustrated in FIG. 6, eliminates the need for a weak bias current transistor, but requires instead a special driver circuit 45 that produces a strobe (ST) signal and a complementary strobe signal which do not simply go from high to low. Since the clock signal must go to an intermediate voltage, that signal will be slower than a signal which is driven hard to $V_{DD}$ and then hard to $V_{SS}$. This is because, effectively, an intermediate voltage reference must be created, that reference necessarily being of higher impedance than the voltage supply to the whole logic network. Additionally, as the clock voltage approaches its intermediate value, both the n-channel and p-channel networks turn on resulting in increased current flow. The aforementioned article, 'Zipper CMOS', describes this method of preventing the partial discharge problem more fully.

The invention is a current regulating means for maintaining a generally constant voltage on the pre-charged nodes of one or more dynamic logic cells during the evaluate cycle of the one or more cells. In general terms, the regulating means comprises a field-effect first transistor for each dynamic logic cell, the first transistor extending parallel to the pre-charging transistor of the logic cell, and a bias circuit defined by a field-effect second transistor extending in series with a resistance element between the voltage supply terminals of the logic cells. The gates of the one or more first transistors are connected to the gate of the second transistor and to the intermediate node positioned between the second transistor and the resistance element. The one or more first transistors and the bias circuit are formed as an integral part of an integrated logic circuit embodying the dynamic logic cells. In this arrangement, the dimensions of each first transistor are selected such that each first transistor has a selected current flow ratio with respect to the second transistor. The amount of current flowing through the second transistor is determined by the size of the resistance element selected for the bias circuit.

In one arrangement, the first and second transistors are p-channel transistors each having its second input connected to the more positive of the voltage supply terminals. In another arrangement, the first and second transistors are n-channel transistors each having its second input connected to the more negative of the voltage supply terminals. The resistance element may be a resistor or a diode. It may also be comprised of field-effect third and fourth transistors connected in series, the third transistor extending between the intermediate node and a central node and the fourth transistor extending between the central node and the voltage supply terminal; the gates of the third and fourth transistors are both connected to the central node. In such arrangement, when the first and second transistors are p-channel transistors the third transistor is a p-channel transistor and the fourth transistor is a n-channel transistor. On the other hand, if the first and second transistors are n-channel transistors then the third transistor is a n-channel transistor and the fourth transistor is a p-channel transistor.

A further form of the invention is a dynamic logic cell assembly comprising a string of dynamic logic cells connected such that the logical output from each logic cell is the logical input to the next logic cell in the string. Each second one of the logic cells along the string is pre-charged from the more positive terminal of the voltage supply of the logic cell assembly by utilizing the bias current regulating means that employs p-channel transistors. Each of the other logic cells along the string is pre-charged from the more neative terminal of the voltage supply of the logic cell assembly by utilizing the bias current regulating means that employs n-channel transistors. In this arrangement, a single bias circuit formed by a resistance element positioned between a p-channel transistor and a n-channel transistor is connected across the terminals of the supply voltage. The gate of the bias circuit p-channel transistor is connected to the gate of each of the p-channel first transistors, and the gate of the bias circuit n-channel transistor is connected to the gate of each of the n-channel first transistors. In this further form of hte invention, the resistance element may take any of the forms previously discussed.

With reference to FIG. 7, a small p-channel transistor 50 extends in parallel with p-channel pre-charge transistor 51 in a manner similar to that described in the prior art. A transistor 52 having a corresponding physical structure to transistor 50 is positioned in a bias circuit generally designated 53. In a CMOS integrated circuit, transistors 50 and 52 would be produced by the same processing and the ratio of the current flow through the two transistors would be fixed by the values chosen for their channel dimensions. Transistor 52 is serially connected to a resistance element 54, which is shown as a reference current ($I_{REF}$) source in FIG. 7. The voltage on the gate of transistor 50 is the same as the voltage on the gate of transistor 52, which itself is the same as the voltage on intermediate node 55 positioned between transistor 52 and resistance element 54. Resistance element 54 is selected so as to create a desired current through bias circuit 53; that current and the ratio of channel dimensions between transistors 50 and 52 determines the current flowing between the drain and source of transistor 50 to pre-charge node 56.

FIGS. 8 and 9 illustrate two means for implementing the resistance element. In FIG. 8, a resistor 60 is utilized. In FIG. 9, a p-channel transistor 61 and a n-channel transistor 62 are connected together serially to form a resistance element. It is also possible to utilize a diode as the resistance element.

The bias voltage ($V_{BIAS}$) on the gate of bias transistor 50 in FIG. 7 could also be used to control a series of similar bias transistors. In other words, the same bias circuit can be used to provide $V_{BIAS}$ for a series of logic circuits. There is no limit on the fanout since the more capacitance on $V_{BIAS}$ the more stable it will be. No specialized clock signals, such as those required by 'Zipper Logic', are needed.

This technique is easily adapted to No Race Logic since the p-channel pre-charge transistors can be connected to the $V_{BIAS}$ of one voltage bias circuit, and the n-channel pre-charge transistors can be connected to the $V_{BIAS}$ of a second voltage bias circuit. For example, the combination of FIG. 7 and FIG. 11 is easily employed in the No Race Logic structure of FIG. 2. It is possible to obtain both of the bias voltages from a single bias circuit; the bias circuits shown in FIGS. 10 and 11 each provide two bias voltages. The circuit in FIG. 10 utilizes a resistor 65 positioned between a p-channel transistor 66 and a n-channel transistor 67, while the circuit in FIG. 11 utilizes a serially-connected p-channel transistor 68 and n-channel transistor 69 as a resistance element.

Since a bias transistor (such as transistor 50 in FIG. 7) is of minimum size, it adds very little, if any, extra capacitance to the pre-charged node to which it is connected. The design of the bias transistor can be easily modified to provide sufficient current to counter the voltage degradation problems which were previously described. The bias transistor current that is required will depend on the logic of the associated logic network. Although the technique has mainly had reference to CMOS circuitry in the foregoing description of the invention, it is equally applicable to NMOS (with depletion mode transistors) technology, and also possibly to Gallium Arsenide technology.

The bias voltage ($V_{BIAS}$) can be easily adapted for different modes of operation. For instance, a low current can be passed through the bias transistors in a stand-by mode. The presence of the bias transistors also allows logic circuits to be operated in the absence of a clock signal. Such arrangement would be similar to that disclosed by David Taylor in Programmable Performance Logic: A Semicustom Alternative; VLSI Design; January, 1985; pages 46 to 52. In such an arrangement, n-channel logic networks can still be utilized with the clock input placed at a continuous high level such that the p-channel pre-charge transistors are turned off. P-channel logic networks can still be utilized with the clock input placed at a continuous low level such that the n-channel pre-charge transistors are turned off. In both cases, current flows through the respective bias transistors. However, such static operation consumes more power and is slower than dynamic operation.

The current-mirror-biased pre-charged logic that has been described is considered to be particularly advantageous for programmable logic array circuits.

I claim:

1. A dynamic logic curicut comprising at least one dynamic logic cell and a bias circuit, each dynamic logic cell comprising a first field-effect transistor having a channel extending between a first supply voltage and a pre-charged node of a respective logic network and also comprising a second field-effect transistor having a channel extending between a second supply voltage and the respective logic network, the gate of each of the first and second transistors being connected to a clocked input signal, the bias circuit comprising a third field-effect transistor for each dynamic logic cell and also comprising a fouth field-effect transistor in each dynamic logic cell extending between the first supply voltage and the pre-charged node of the respective logic network, the gate of each of the third transistors being connected to the gate of the fourth transistor, the channel of the fourth transistor extending between the first supply voltage and an intermediate node, the resistance element extending between the intermediate node and the second supply voltage, the gate of the fourth transistor being connected to the intermediate node, whereby all of the transistors and the resistance element are formed as an integral part of an integrated logic circuit, and whereby current flows from the first supply voltage to the pre charged nodes of the logic networks at a steady rate determined by the relative dimensions selected for each of the third transistors and the fourth transistor and by the resistance value selected for the resistance element.

2. A dynamic logic circuit as in claim 1, wherein each of the first and third transistors and the fourth transistor are p-channel transistors, wherein each of the second transistors are n-channel transistors, and wherein the first supply voltage is more positive than the second supply voltage.

3. A dynamic logic circuit as in claim 1, wherein each of the first and third transistors and the fourth transistor are n-channel transistors, wherein each of the second transistors are p-channel transistors, and wherein the first supply voltage is more negative than the second supply voltage.

4. A dynamic logic circuit as in claim 1, wherein the resistance element comprises a resistor.

5. A dynamic logic circuit as in claim 1, wherein the resistance element comprises a diode.

6. A dynamic logic circuit as in claim 2, wherein the resistance element comprises a fifth and a sixth field-effect transistors having their channels connected serially, the gate of each of the fifth and sixth transistors being connected together and to the connection point between the channels of those transistors, the fifth transistor being a p-channel transistor and the sixth transistor being a n-channel transistor.

7. A dynamic logic circuit as in claim 3, wherein the resistance element comprises a fifth and a sixth field-effect transistors having their channels connected serially, the gate of each of the fifth and sixth transistros being connected together and to the connection point between the channels of those transistors, the fifth transistor being a n-channel transistor and the sixth transistor being a p-channel transistor.

8. A dynamic logic circuit comprising at least one of a first type of dynamic logic cell and at least one of a second type of dynamic logic cell, and also comprising a bias circuit, each of the first type of dynamic logic cells comprising a first field-effect transistor having a channel extending between a first supply voltage and a pre-charged node of a respective logic network and also comprising a second field-effect transistor having a channel extending between a second supply voltage and the respective logic network, the gate of each of the first and second transistors being connected to a first clocked input signal each of the second type of dynamic logic cells comprising a field-effect third transistor having a channel extending between the second supply voltage and a pre-charged node of a respective logic network and also comprising a fourth field-effect transistor having a channel extending between the first supply voltage and the respective logic network, the gate of each of the third and fourth transistors being connected to a second clocked input signal, the bias circuit comprising a fifth field-effect transistor for each of the first type of dynamic logic cells and comprising a sixth field-effect transistor for each of the second type of dynamic logic cells, the channel of the fifth transistor in each first type of dynamic logic cell extending between the first supply voltage and the pre-charged node of the respective logic notwork, the channel of the sixth transistor in each second type of dynamic logic cell extending between the second supply voltage and the pre-charged node of the respective logic network, the bias circuit also comprising seventh and eighth field-effect transistors and a resistance element, the channel of the seventh transistor being connected between the first supply voltage and a first intermediate node, the channel of the eighth transistor being connected between the second supply voltage and a second intermediate node, the resistance element extending between the first and second intermediate nodes, the gate of each of the fifth transistors being connected to the gate of the seventh transistor and to the first intermediate node, the gate of each of the sixth transistors being connected to the gate of the eighth transistor and to the second intermediate node, whereby all of the transistors and the resistance element are formed as an integral part of an integrated logic circuit, whereby current flows from the first supply voltage to the pre-charged nodes of the logic networks of the first type of logic cells at a steady rate determined by the resistance value selected for the resistance element and by the relative dimensions selected for each of the fifth transistors and the seventh transistor, and whereby current flows from the second supply voltage to the pre-charged nodes of the logic networks of the second type of logic cells at a steady rate determined by the resistance value selected for the resistance element and by the relative dimensions selected for each of the sixth transistors and the eighth transistor.

* * * * *

UNITED STATES PATENT AND TRADEMARK OFFICE
CERTIFICATE OF CORRECTION

PATENT NO. : 4,797,580

DATED : January 10, 1989

INVENTOR(S) : Stephen K. Sunter

It is certified that error appears in the above-identified patent and that said Letters Patent is hereby corrected as shown below:

Column 6, line 49, "fouth" should read -- fourth --.

Column 6, line 49, after "transistor" insert -- and a resistance element, the channel of the third transistor --.

Column 7, line 42, after "signal" insert a comma.

Column 8, line 13, "notwork" should read -- network --.

Signed and Sealed this

Fourth Day of July, 1989

Attest:

DONALD J. QUIGG

Attesting Officer

Commissioner of Patents and Trademarks